(12) United States Patent
Kim et al.

(10) Patent No.: US 8,021,912 B2
(45) Date of Patent: Sep. 20, 2011

(54) METHOD OF FABRICATING AN IMAGE SENSOR HAVING AN ANNEALING LAYER

(75) Inventors: Yi Tae Kim, Hwaseong-si (KR); Kyung Ho Lee, Suwon-si (KR); Sae-Young Kim, Suwon-si (KR); Yun Ho Jang, Seoul (KR); Jung Chak Ahn, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 78 days.

(21) Appl. No.: 12/320,543

(22) Filed: Jan. 29, 2009

(65) Prior Publication Data

US 2009/0209058 A1    Aug. 20, 2009

(30) Foreign Application Priority Data

Jan. 29, 2008  (KR) .................. 10-2008-0009257

(51) Int. Cl.
*H01L 21/00* (2006.01)

(52) U.S. Cl. ............ 438/75; 438/90; 438/116; 438/799; 257/E31.122

(58) Field of Classification Search .............. 438/69, 438/73, 75, 90, 116, 799; 257/E31.122
See application file for complete search history.

(56) References Cited

U.S. PATENT DOCUMENTS

| | | | |
|---|---|---|---|
| 6,569,703 B1 * | 5/2003 | Fukusho | 438/60 |
| 6,806,522 B2 | 10/2004 | Ohkubo | |
| 2004/0075092 A1 * | 4/2004 | Arao | 257/66 |
| 2008/0032438 A1 * | 2/2008 | Wen et al. | 438/60 |
| 2008/0062296 A1 * | 3/2008 | Ogura et al. | 348/308 |
| 2008/0142919 A1 * | 6/2008 | Shin | 257/435 |
| 2008/0283727 A1 * | 11/2008 | Kitano et al. | 250/208.1 |

FOREIGN PATENT DOCUMENTS

| | | |
|---|---|---|
| JP | 06-334162 | 12/1994 |
| JP | 2002-110955 | 4/2002 |
| KR | 10-2007-0023419 | 2/2007 |

\* cited by examiner

*Primary Examiner* — Hsien-ming Lee
*Assistant Examiner* — Kevin Parendo
(74) *Attorney, Agent, or Firm* — Harness, Dickey & Pierce, P.L.C.

(57) ABSTRACT

A method of manufacturing an image sensor is provided. In this method, a photoelectric conversion unit may be formed within a semiconductor substrate, wherein the semiconductor substrate includes an active pixel region and an optical black region. An annealing layer may be formed on the active pixel region and the optical black region and etched so that the annealing layer covers at least a portion of the optical black region. A wiring pattern may be formed on the annealing layer. A light-blocking pattern may be formed on the wiring pattern so as to cover the entire photoelectric conversion unit of the optical black region, thereby blocking light from being incident upon the optical black region.

17 Claims, 5 Drawing Sheets

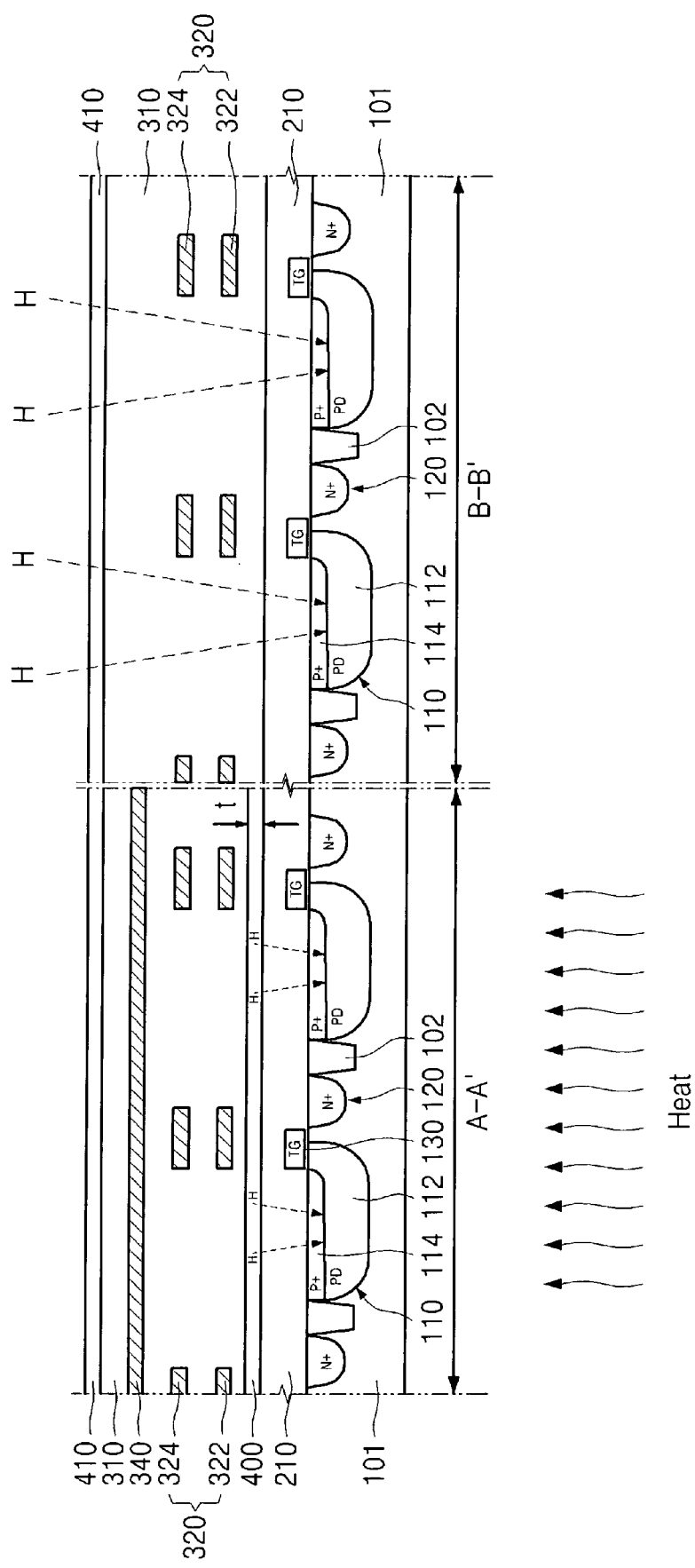

METHOD OF FABRICATING AN IMAGE SENSOR HAVING AN ANNEALING LAYER

PRIORITY STATEMENT

This application claims priority under 35 U.S.C. §119 to Korean Patent Application No. 10-2008-0009257, filed on Jan. 29, 2008, in the Korean Intellectual Property Office (KIPO), the entire contents of which are incorporated herein by reference.

BACKGROUND

1. Technical Field

Example embodiments relate to a method of fabricating an image sensor, and more particularly, to a method of fabricating an image sensor having improved reliability.

2. Description of Related Art

Image sensors are devices that convert an optical image into an electrical signal. With recent developments in the computer industry and in the communication industry, a demand for CMOS image sensors having improved performance is increasing in various fields, e.g., digital cameras, camcorders, personal communication systems (PCSs), game players, security cameras, medical micro cameras, and robots.

Each unit pixel of an image sensor includes a photoelectric conversion unit and a charge transmission unit which transmits electric charges generated by photoelectric conversion performed on incident light in the photoelectric conversion unit to a charge detection unit.

In a process for manufacturing an image sensor, etching and/or ion implementation may be repeated. Silicon and oxygen may combine on the surface of a semiconductor substrate, causing damage to the substrate, resulting in a dangling bond, e.g., (—Si—O—) and/or (—Si—). The dangling bond deteriorates a dark current which flows from the photoelectric conversion unit to the charge transmission unit, thereby degrading the reliability of the image sensor. To remove this dangling bond, a method of radiating ultraviolet (UV) rays onto the semiconductor substrate or diffusing hydrogen may be used.

The image sensor includes an active pixel region and an optical black region. The active pixel region receives incident light and converts the incident light into an electrical signal. The optical black region blocks inflow of light and thus provides a reference of a black signal to the active pixel region.

In the optical black region of the image sensor, a light-blocking pattern for blocking light inflow is formed. The light-blocking pattern does not only block light inflow but also blocks UV or hydrogen from moving to the semiconductor substrate during a UV or hydrogen annealing process for removing a dangling bond.

In other words, in the active pixel region of the image sensor, the dangling bond is removed using UV or hydrogen. On the other hand, in the optical black region of the image sensor, diffusion of UV or hydrogen is prevented or reduced by the light-blocking pattern, and thus, the dangling bond is not removed. Therefore, signals represented in the active pixel region and the optical black region of the image sensor are different, causing degradation of the reliability of the image sensor.

SUMMARY

Example embodiments provide a method of fabricating an image sensor having improved reliability.

According to example embodiments, a method of manufacturing an image sensor may include forming a photoelectric conversion unit within a semiconductor substrate, wherein the semiconductor substrate includes an active pixel region and an optical black region; forming an annealing layer on the active pixel region and the optical black region; etching the annealing layer so that the annealing layer covers at least a portion of the optical black region; forming a wiring pattern on the annealing layer; and forming a light-blocking pattern on the wiring pattern so as to cover the entire photoelectric conversion unit of the optical black region, thereby blocking light from being incident upon the optical black region.

BRIEF DESCRIPTION OF THE DRAWINGS

Example embodiments are described in further detail below with reference to the accompanying drawings. It should be understood that various aspects of the drawings may be exaggerated for clarity.

FIG. 5 illustrates an annealing process which is performed to remove dangling bonds formed by the image sensor illustrated in FIG. 4.

Figure 1:
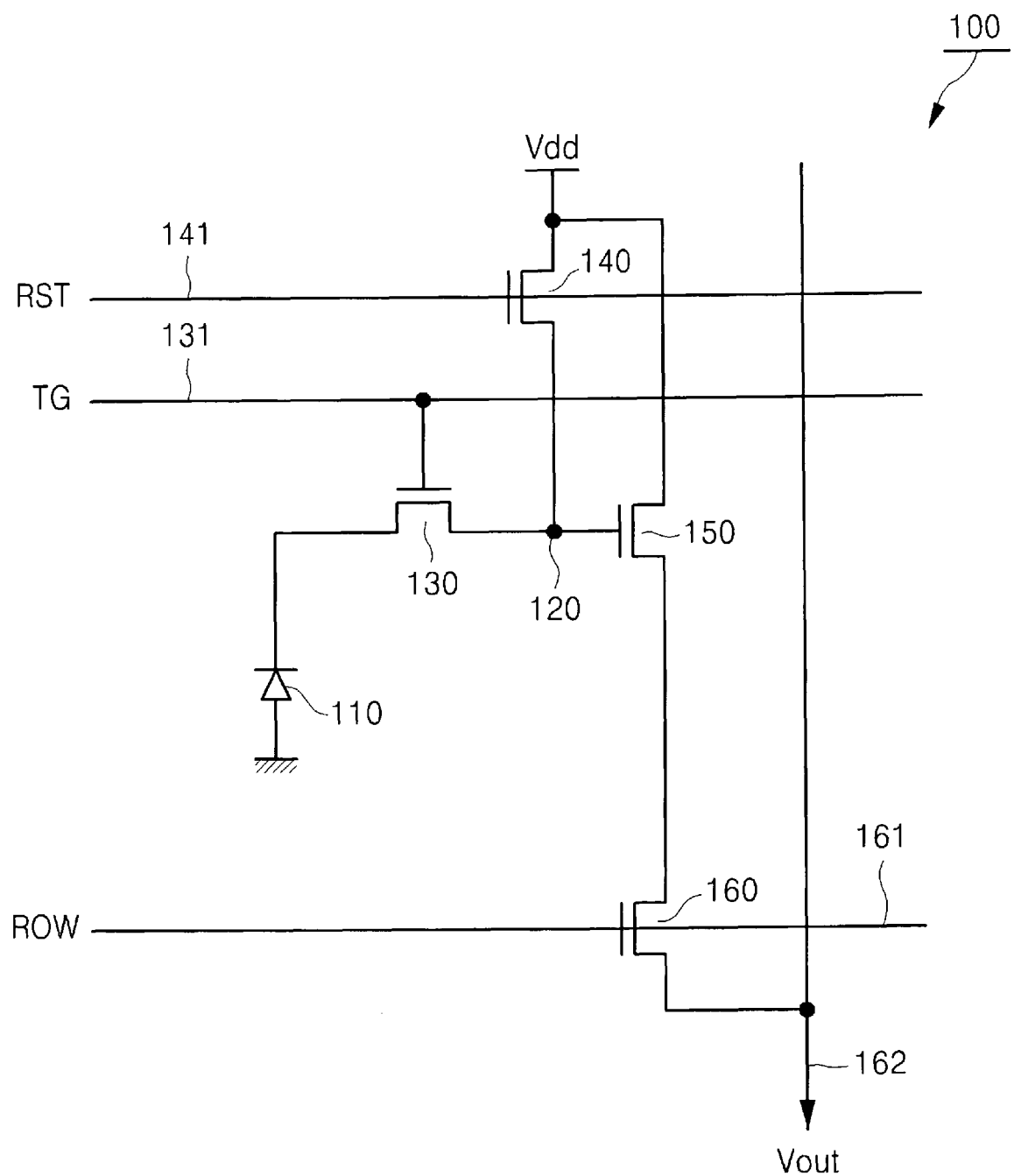
FIG. 1 is a circuit diagram of a unit pixel of an image sensor, according to example embodiments.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

The attached drawings for illustrating example embodiments are referred to in order to gain a sufficient understanding, the merits thereof, and the objectives accomplished by the implementation of example embodiments. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Image sensors according to example embodiments may include a charge coupled device (CCD) sensor and a CMOS image sensor. The CCD may generate small noise and may provide a high-quality image, as compared with the CMOS image sensor. The CMOS image sensor is simply driven and may be implemented according to various scanning methods. Because signal processing circuits may be integrated into a single chip, the CMOS image sensor may be made compact. In addition, the CMOS image sensor may compatibly use a CMOS process technique, thus reducing the manufacturing costs of CMOS image sensors. The CMOS image sensor may consume relatively small power, and accordingly, may be easily applied to products that have limits in battery capacity. Thus, such a CMOS image sensor is illustrated as the image sensors according to example embodiments. However, the technical spirit of example embodiments may also be applied to CCDs. Hereinafter, example embodiments will be described in detail with reference to the attached drawings.

FIG. 1 is a circuit diagram of a unit pixel 100 of an image sensor according to example embodiments. Referring to FIG. 1, the unit pixel 100 may include a photoelectric conversion unit 110, a charge detection unit 120, a charge transmission unit 130, a reset unit 140, an amplification unit 150, and a selection unit 160. In example embodiments, the unit pixel 100 including four transistors is illustrated. However, the unit pixel 100 may include N (where N is a natural number, for example, 3 or 5) transistors.

The photoelectric conversion unit 110 may absorb incident light and may accumulate charges corresponding to the amount of the incident light. The photoelectric conversion unit 110 may be a photo diode, a photo transistor, a photo gate, a pinned photo diode (PPD), or a combination of two or more of the above-described devices.

A floating diffusion region may be used as the charge detection unit 120. The charge detection unit 120 may receive the accumulated charges from the photoelectric conversion unit 110. Because the charge detection unit 120 has parasitic capacitance, charges may be accumulatively stored in the charge detection unit 120. The charge detection unit 120 may be electrically connected to a gate of the amplification unit 150 and may accordingly control the amplification unit 150.

The charge transmission unit 130 may transmit the charges from the photoelectric conversion unit 110 to the charge detection unit 120. The charge transmission unit 130 may be made up of one transistor and may be controlled by a charge transmission signal TG. The reset unit 140 may periodically reset the charge detection unit 120. A source of the reset unit 140 may be connected to the charge detection unit 120, and a drain thereof may be connected to a power source Vdd. The reset unit 140 may be driven in response to a reset signal RST.

The amplification unit 150 may be combined with a constant current source (not shown) located outside the unit pixel 100 so as to serve as a source follower buffer amplifier. A voltage which varies in response to a voltage of the charge detection unit 120 may be output to a vertical signal line 162. The source of the amplification unit 150 may be connected to a drain of the selection unit 160, and a drain thereof may be connected to the power source Vdd. The selection unit 160 may select the unit pixel 100 which is to be read in units of rows. The selection unit 160 may be driven in response to a selection signal ROW, and a source of the selection unit 160 may be connected to the vertical signal line 162.

Driving signal lines 131, 141, and 161 of the charge transmission unit 130, the reset unit 140, and the selection unit 160 may extend in a row direction (that is, a horizontal direction) so that unit pixels on an identical row are simultaneously driven.

Figure 2:
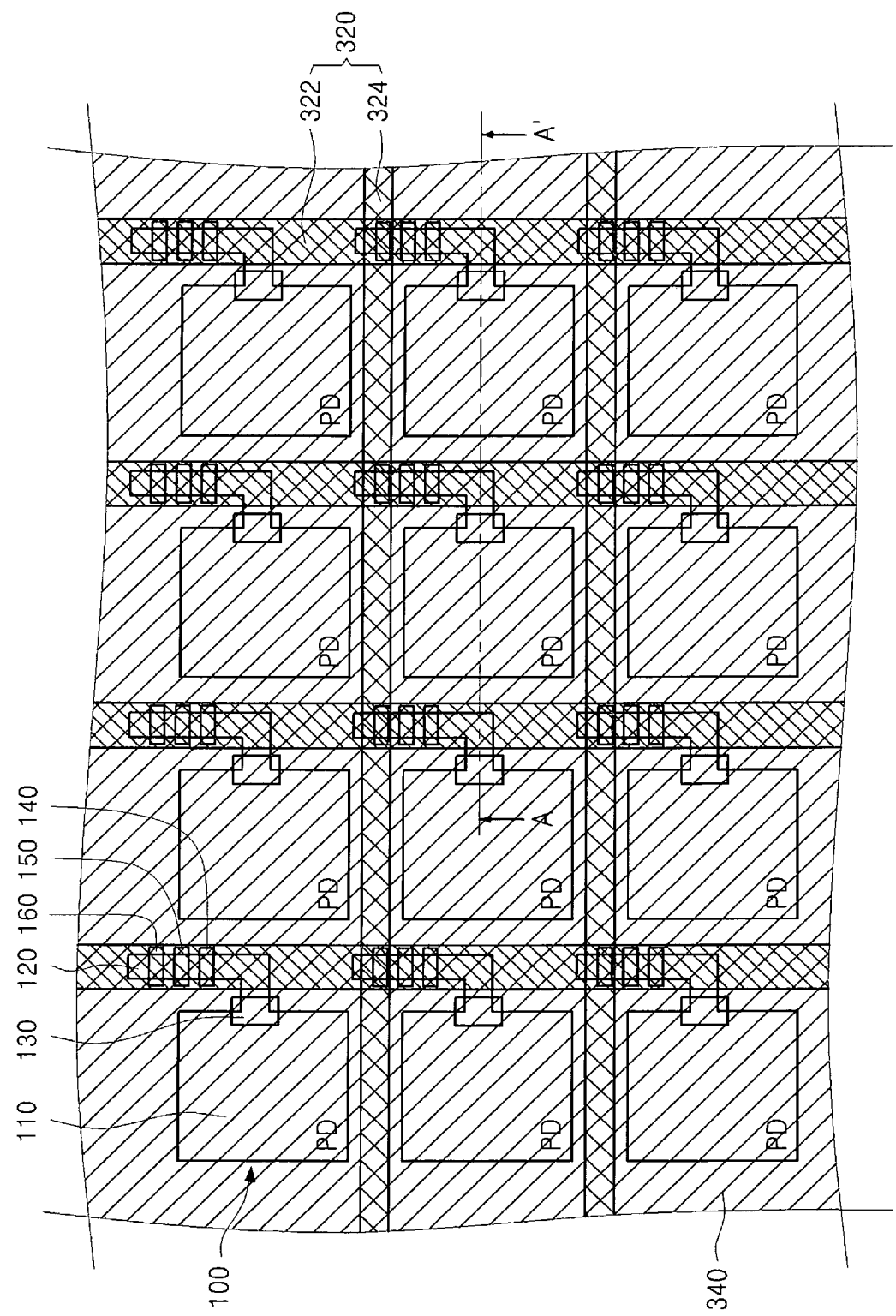
FIG. 2 is a schematic layout of an optical black region of an image sensor according to example embodiments.
Figure 3:
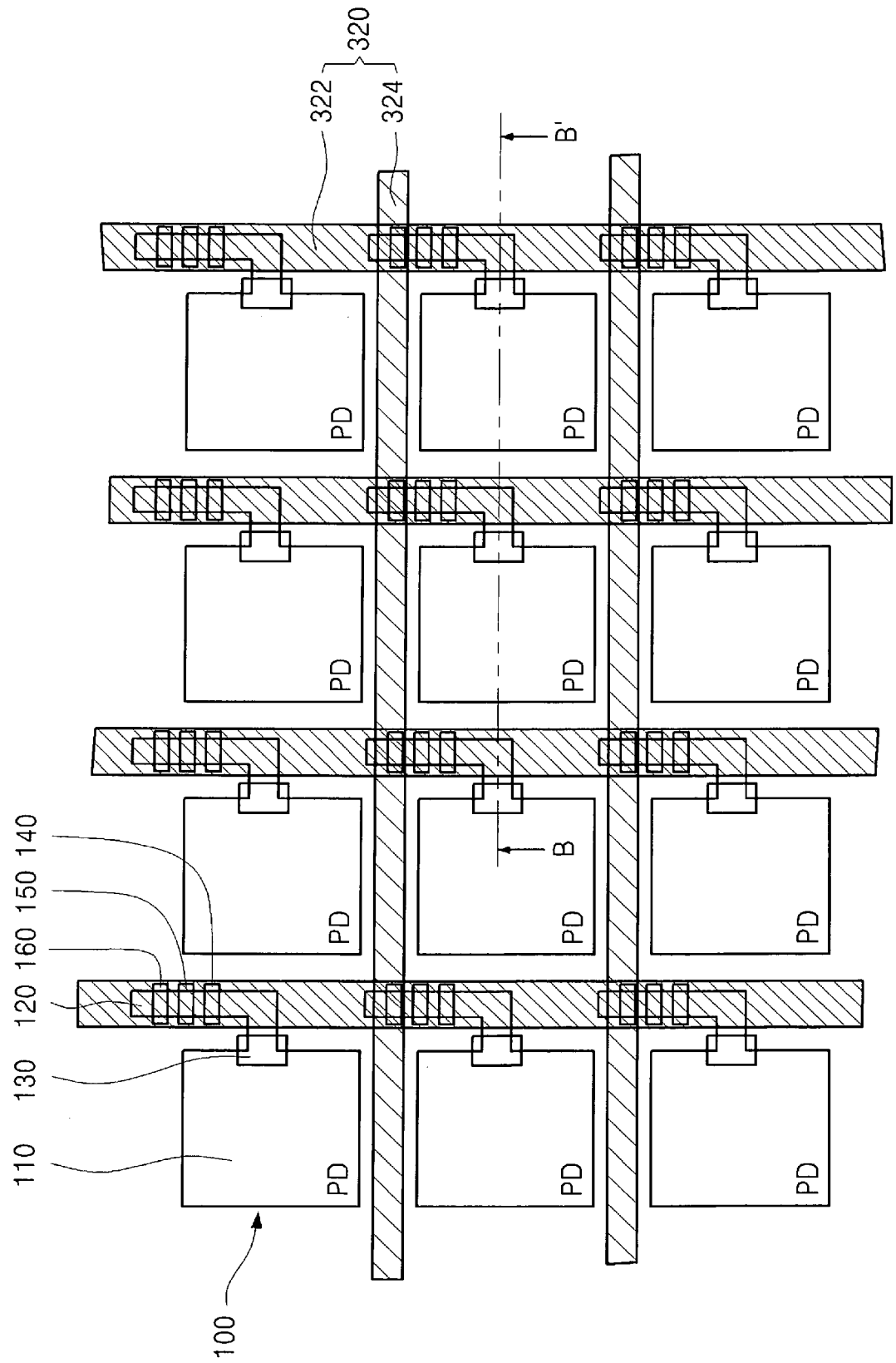
FIG. 3 is a schematic layout of an active pixel region of an image sensor according to example embodiments.
Figure 4:
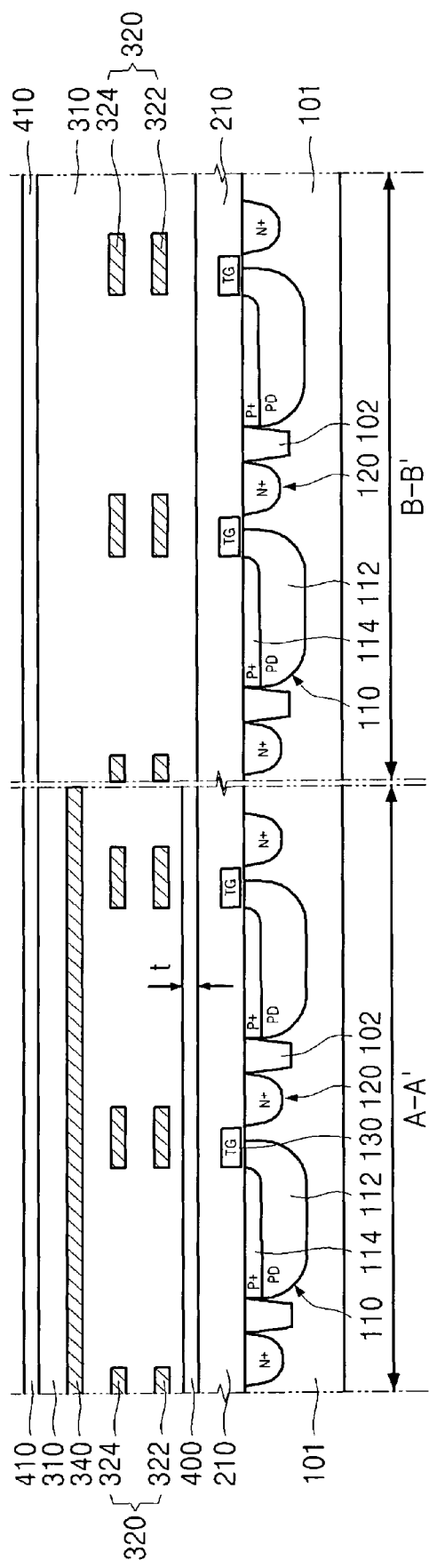
FIG. 4 illustrates a cross-section taken along line A-A' of FIG. 2 and a cross-section taken along line B-B'.

An image sensor according to example embodiments will now be described with reference to FIGS. 2 through 4. FIG. 2 is a schematic layout of an optical black region of an image sensor according to example embodiments. FIG. 3 is a schematic layout of an active pixel region of an image sensor according to example embodiments. FIG. 4 illustrates a cross-section taken along line A-A' of FIG. 2 and a cross-section taken along line B-B' of FIG. 3.

Referring to FIGS. 2 through 4, the image sensor may include photoelectric conversion units 110, charge detection units 120, charge transmission units 130, an interlayer insulation layer 210, an annealing layer 400, wiring patterns 320, a light-blocking pattern 340, an inter-metal insulation layer 310, and a passivation layer 410 which are formed on a semiconductor substrate 101. Although not shown in FIGS. 2 through 4, the image sensor may further include a color filter (not shown) and a micro lens (not shown) which are formed on the passivation layer 410.

Isolation areas 102 may be formed in the semiconductor substrate 101 so as to define active areas. The isolation areas 102 may be generally field oxide (FOX) or shallow trench isolation (STI) areas which are formed using a LOCal Oxidation of Silicon (LOCOS) method. An active pixel region and an optical black region may be defined in the semiconductor substrate 101. The active pixel region may receive light and may convert the light into a signal, and the optical black region may provide a reference of a signal, for example, a black signal, to the active pixel region and thus may not receive light.

The photoelectric conversion units 110, which accumulate charges generated due to absorption of light energy, may be formed on the active areas of the semiconductor substrate 101. Each of the photoelectric conversion units 110 may include an N-type photo diode 112 and a P+-type pinning layer 114. The charge detection units 120 may be formed on the semiconductor substrate 101, and transistors corresponding to the charge transmission units 130, the reset units 140, the amplification units 150, and the selection units 160 may be formed.

The interlayer insulation layer 210 may be formed on the photoelectric conversion units 110 and the charge transmission units 130 so as to cover the entire surface of the semiconductor substrate 101 and to fill empty spaces not occupied by the transistors. The interlayer insulation layer 210 may be a silicon oxide ($SiO_2$) layer.

An annealing layer 400 may be formed on the interlayer insulation layer 210 so as to cover at least a portion of the optical black region of the semiconductor substrate 101. The annealing layer 400 may be a nitride layer formed using a plasma CVD method, for example, a plasma enhanced (PE)-SiN thin layer. The annealing layer 400 may be formed to a thickness t of about 1000~about 2000 Å on the interlayer insulation layer 210.

The wiring patterns 320 may be formed over the annealing layer 400 of the optical black region of the semiconductor substrate 101 and the interlayer insulation layer 210 of the active pixel region thereof. Each of the wiring patterns 320 may be a single layer or made up of two or three layers. In example embodiments, each of the wiring patterns 320 may include a first wiring pattern 322 and a second wiring pattern 324. The wiring patterns 320 may be formed of aluminum (Al), tungsten (W), or copper (Cu). The wiring patterns 320 may be identically formed in both the active pixel region and the optical black region, for example, peripheral circuit areas of the active pixel region and the optical black region.

The peripheral circuit areas may denote areas not occupied by the photoelectric conversion units 110 from the semiconductor substrate 101. Areas occupied by the photoelectric conversion units 110 from the semiconductor substrate 101 may be defined as light-receiving areas. Thus, each of the active pixel region and the optical black region may include a light-receiving area and a peripheral circuit area.

The second wiring patterns 324 may be arranged over the first wiring patterns 322. The first wiring patterns 322 and the second wiring patterns 324 may be connected to each other by via holes (not shown). The light-blocking pattern 340 may be formed over the wiring patterns 320 in the optical black region of the semiconductor substrate 101. The light-blocking pattern 340 may block external light.

The light-blocking pattern 340 may also be formed in the active pixel region of the semiconductor substrate 101. For example, the light-blocking pattern 340 may be arranged over the wiring patterns 320 of the active pixel region. The light-blocking pattern 340 in the active pixel region may be used as both a light blocking layer and a wiring. The inter-metal insulation layer 310 may be filled between the wiring patterns 320 and the light-blocking pattern 340. Examples of the inter-metal insulation layer 310 may include flowable oxide (FOX), high density plasma (HDP), Tonen SilaZene (TOSZ), spin on glass (SOG), and undoped silica glass (USG).

The passivation layer 410 may be formed on the inter-metal insulation layer 310. For example, the passivation layer 410 may be an insulation layer, e.g., a nitride layer. The passivation layer 410 may protect the wiring patterns 320 and the unit pixel 100 which are formed thereunder. Hydrogen may be provided into the semiconductor substrate 101 through a thermal treatment process. Color filters (not shown) in which red, green, and blue colors are arranged in a Bayer form may be formed on the passivation layer 410. Micro lenses (not shown) may be formed at locations corresponding to the photoelectric conversion units 110 over the color filters. The micro lenses may be formed of TMR-based resin or MFR-based resin.

A method of manufacturing the above-described image sensor will now be described with reference to FIGS. 4 and 5. FIG. 5 illustrates an annealing process which is performed to remove a dangling bond formed by the image sensor illustrated in FIG. 4. Referring to FIGS. 4 and 5, the isolation areas 102 may be formed in the semiconductor substrate 101 in which the active pixel region and the optical black region are defined, thereby defining active areas (not shown). By ion-implementing impurities into the active areas, the photoelectric conversion units 110, each including the photo diode 112 and the pinning layer 114, may be formed, and transistors corresponding to the charge detection units 120, the charge transmission units 130, the reset units 140 (see FIG. 1), the amplification units 150 (see FIG. 1), and the selection units 160 (see FIG. 1) may be formed.

The interlayer insulation layer 210 may be formed to cover the entire surface of the semiconductor substrate 101, and may fill empty spaces not occupied by the transistors. The annealing layer 400 may be formed on the interlayer insulation layer 210 so as to cover the entire optical black region or at least a portion of the optical black region.

For example, a nitride (SiN) layer may be formed to the thickness t of about 1000~2000 Å on the entire surface of the interlayer insulation layer 210 according to a plasma CVD method. The entire surface of the SiN layer may be coated with a photosensitive material (not shown), and patterned so that the coated photosensitive material may remain only in the optical black region. The exposed SiN layer in the active pixel region may be etched by using the photosensitive material remaining in the optical black region as an etch mask. The remaining photosensitive material may be removed using a cleaning process. Thus, the annealing layer 400 capable of covering the entire optical black region or at least a portion of the optical black region may be formed.

The annealing layer 400 may be formed not only in the optical black region of the semiconductor substrate 101 but also in the active pixel region thereof. However, in example embodiments, the annealing layer 400 in the active pixel region may reduce the transmissivity of external light. Thus, in example embodiments, the annealing layer 400 may be formed only in the optical black region of the semiconductor substrate 101. Thereafter, the wiring patterns 320 may be formed in the active pixel region and the optical black region.

For example, a conductive layer (not shown) may be formed of Al, TiN, Ti, or Cu on the interlayer insulation layer 210 or the annealing layer 400 and patterned to form the first wiring patterns 322. Another conductive layer may be formed over the first wiring patterns 322 and patterned to form the second wiring patterns 324. The second wiring patterns 324 may be arranged over the first wiring patterns 322.

The light-blocking pattern 340 may be formed over the second wiring patterns 324 of the optical black region. The light-blocking pattern 340 may be formed to cover the entire optical black region. For example, a conductive layer may be formed over the second wiring patterns 324 of the optical black region and patterned to form the light-blocking pattern 340. The light-blocking pattern 340 may be formed to cover the entire optical black region so as to block all of the light from being incident upon the photoelectric conversion units 110 of the optical black region from an external source.

Spaces formed by two of the first wiring patterns 322, the second wiring patterns 324, and the light-blocking pattern 340 may be filled with the inter-metal insulation layer 310. The passivation layer 410 may be formed on the inter-metal insulation layer 310. The passivation layer 410 may be an insulation layer, e.g., a nitride layer. A first annealing process, for example, a hydrogen annealing process, may be performed to remove a dangling bond of the active pixel region from an upper portion of the semiconductor substrate 101.

In the first annealing process, hydrogen may be supplied from an area over the semiconductor substrate 101 to the active pixel region in order to remove a dangling bond formed within the active pixel region of the semiconductor substrate 101. In other words, the first annealing process may be performed by forming the passivation layer 410, supplying hydrogen from the area over the semiconductor substrate 101 to the active pixel region, and diffusing hydrogen included in the passivation layer 410 to the semiconductor substrate 101.

When the first annealing process is performed, the hydrogen supplied to the active pixel region of the semiconductor substrate 101 may be diffused directly onto the semiconductor substrate 101, and the dangling bond in the active pixel region may be removed. UV instead of hydrogen may be supplied to an upper portion of the semiconductor substrate 101 in the first annealing process, thereby removing the dangling bond from the active pixel region. A second annealing process, for example, a heating annealing process, may be performed on an area under the semiconductor substrate 101 in order to remove the dangling bond of the optical black region.

In the second annealing process, a bottom surface of the semiconductor substrate 101 may be heated to remove the dangling bond formed in the optical black region of the semiconductor substrate 101. The second annealing process may be performed by heating the bottom surface of the semiconductor substrate 101, for example, a bottom surface of the optical black region of the semiconductor substrate 101 where the annealing layer 400 has been formed, at about 400~500° C. for about 50-70 minutes.

When the second annealing process is performed, hydrogen ions may be discharged from the annealing layer 400 of the optical black region of the semiconductor substrate 101, and the discharged hydrogen ions may be diffused to the semiconductor substrate 101, thereby removing a dangling bond of the optical black region. The second annealing process may be performed simultaneously with the first annealing process, or the second annealing process may be formed after the first annealing process.

Accordingly, the image sensor may include the annealing layer 400 in the optical black region of the semiconductor substrate 101 and may perform an annealing process, thereby effectively removing a dangling bond from the active pixel region and the optical black region of the semiconductor substrate 101, and reducing a dark current. In addition, because the dangling bond is effectively removed from the active pixel region and the optical black region of the semiconductor substrate 101, signal levels may be measured at an identical criterion, and the reliability of the image sensor may be improved.

In an image sensor manufactured according to example embodiments, an annealing layer may be formed in an optical black region of an image sensor, and hydrogen ions may be diffused from the annealing layer through an annealing process. Thus, a dangling bond of the optical black region may be effectively removed, and a reliability-improved image sensor may be manufactured.

While example embodiments have been particularly shown and described, it will be understood by those of ordinary skill in the art that various changes in form and details may be made therein without departing from the spirit and scope of example embodiments as defined by the following claims.

What is claimed is:

1. A method of manufacturing an image sensor, the method comprising:
    forming a photoelectric conversion unit within a semiconductor substrate, wherein the semiconductor substrate includes an active pixel region and an optical black region;
    forming an annealing layer on the active pixel region and the optical black region;
    etching the annealing layer so that the annealing layer covers at least a portion of the optical black region;
    forming a wiring pattern on the annealing layer;
    forming a light-blocking pattern on the wiring pattern so as to cover the optical black region including an entirety of the photoelectric conversion unit therein, thereby blocking light from being incident upon the optical black region;
    performing a first annealing process on an upper portion of the semiconductor substrate to remove dangling bonds from the active pixel region; and
    performing a second annealing process on a lower portion of the semiconductor substrate to remove dangling bonds from the optical black region.

2. The method of claim 1, wherein the annealing layer is formed to a thickness of about 1000-2000 Å.

3. The method of claim 1, wherein the annealing layer is a plasma enhanced (PE)-SiN layer.

4. The method of claim 1, wherein the first annealing process is one of a process of radiating ultraviolet (UV) rays from an area over the semiconductor substrate and a process of diffusing hydrogen from the area over the semiconductor substrate.

5. The method of claim 1, wherein the second annealing process includes applying heat to a bottom surface of the semiconductor substrate so as to discharge hydrogen ions from the annealing layer.

6. The method of claim 5, wherein the second annealing process includes applying the heat having a temperature of about 400-500° C. to the bottom surface of the semiconductor substrate.

7. The method of claim 5, wherein the second annealing process includes applying the heat to the bottom surface of the semiconductor substrate for about 50-70 minutes.

8. The method of claim 1, after forming the light-blocking pattern, further comprising:
forming a passivation layer on the light-blocking pattern.

9. The method of claim 1, wherein the light-blocking pattern is formed in the active pixel region, and the light-blocking pattern in the active pixel region is arranged on the wiring patterns of the active pixel region.

10. The method of claim 1, further comprising:
forming a charge detection unit configured to receive accumulated charges from the photoelectric conversion unit.

11. The method of claim 10, further comprising:
forming a charge transmission unit configured to transmit the accumulated charges from the photoelectric conversion unit to the charge detection unit,
wherein the charge transmission unit includes one transistor and is controlled by a charge transmission signal.

12. The method of claim 10, further comprising:
forming a reset unit configured to periodically reset the charge detection unit,
wherein the reset unit includes a source that is connected to the charge detection unit and a drain that is connected to a power source, and is driven in response to a reset signal.

13. The method of claim 10, further comprising:
forming an amplification unit including a gate that is electrically connected to the charge detection unit,
wherein the charge detection unit controls the amplification unit.

14. The method of claim 13, further comprising:
forming a selection unit including a drain that is connected to a source of the amplification unit,
wherein the selection unit is driven in response to a selection signal.

15. The method of claim 1, wherein the wiring pattern is formed of aluminum (Al), tungsten (W), or copper (Cu).

16. The method of claim 1, further comprising:
forming an inter-metal insulation layer between the wiring pattern and the light-blocking pattern,
wherein the inter-metal insulation layer is made of one selected from the group consisting of flowable oxide (FOX), high density plasma (HDP)-formed insulator, spin on glass (SOG), and undoped silica glass (USG).

17. The method of claim 16, further comprising:
forming a passivation layer on the inter-metal insulation layer to protect the wiring pattern,
wherein the passivation layer is a nitride layer.

* * * * *